US012575342B2

(12) United States Patent
Nishiguchi

(10) Patent No.: US 12,575,342 B2
(45) Date of Patent: Mar. 10, 2026

(54) SILICON CARBIDE EPITAXIAL SUBSTRATE AND METHOD OF MANUFACTURING SILICON CARBIDE EPITAXIAL SUBSTRATE

(71) Applicant: SUMITOMO ELECTRIC INDUSTRIES, LTD., Osaka (JP)

(72) Inventor: Taro Nishiguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 601 days.

(21) Appl. No.: 18/012,337

(22) PCT Filed: May 20, 2021

(86) PCT No.: PCT/JP2021/019171
§ 371 (c)(1),
(2) Date: Dec. 22, 2022

(87) PCT Pub. No.: WO2022/004181
PCT Pub. Date: Jan. 6, 2022

(65) Prior Publication Data
US 2023/0261057 A1     Aug. 17, 2023

(30) Foreign Application Priority Data
Jul. 2, 2020     (JP) ................................. 2020-114810

(51) Int. Cl.
H01L 21/02          (2006.01)
H10D 62/832         (2025.01)
(52) U.S. Cl.
CPC .. H01L 21/02378 (2013.01); H01L 21/02447 (2013.01); H01L 21/02529 (2013.01);
(Continued)

(58) Field of Classification Search
CPC ......... H01L 21/02378; H01L 21/02447; H01L 21/02529; H01L 21/02576;
(Continued)

(56) References Cited

U.S. PATENT DOCUMENTS

2015/0303267 A1     10/2015   Masuda et al.
2016/0086799 A1     3/2016    Hiyoshi
(Continued)

FOREIGN PATENT DOCUMENTS

JP          8-130248  A      5/1996
JP          2014-138026 A    7/2014
(Continued)

*Primary Examiner* — Eliseo Ramos Feliciano
*Assistant Examiner* — Timothy Edward Duren
(74) *Attorney, Agent, or Firm* — Renner, Otto, Boisselle & Sklar, LLP

(57)          ABSTRACT

A silicon carbide epitaxial substrate according to the present disclosure includes: a silicon carbide substrate; a first silicon carbide epitaxial layer disposed on the silicon carbide substrate; and a second silicon carbide epitaxial layer disposed on the first silicon carbide epitaxial layer. When an area density of first particles in the first silicon carbide epitaxial layer is defined as a first area density and an area density of second particles in the second silicon carbide epitaxial layer is defined as a second area density, a value determined by dividing the first area density by the second area density is more than 0.5 and less than 1. The first particles and the second particles each have a maximum diameter of 2 $\mu$m to 50 $\mu$m.

11 Claims, 17 Drawing Sheets

(52) U.S. Cl.
CPC .. *H01L 21/02576* (2013.01); *H01L 21/02609*
(2013.01); *H01L 21/0262* (2013.01); *H01L*
*21/02658* (2013.01); *H10D 62/8325* (2025.01)

(58) Field of Classification Search
CPC ........... H01L 21/02609; H01L 21/0262; H01L
21/02658; H10D 62/8325
See application file for complete search history.

(56) References Cited

U.S. PATENT DOCUMENTS

| | | | | |
|---|---|---|---|---|
| 2018/0323262 | A1* | 11/2018 | Hori ..................... | H10D 62/405 |
| 2018/0363166 | A1* | 12/2018 | Wada .................... | H01L 21/046 |
| 2019/0013198 | A1* | 1/2019 | Itoh ...................... | H10D 62/157 |
| 2020/0149188 | A1* | 5/2020 | Asamizu ................. | C30B 29/36 |
| 2021/0320005 | A1* | 10/2021 | Kanbara ........... | H01L 21/02433 |

FOREIGN PATENT DOCUMENTS

| | | | |
|---|---|---|---|
| JP | 2016-63190 | A | 4/2016 |
| JP | 2020-83671 | A | 6/2020 |
| WO | 2017/043607 | A | 3/2017 |
| WO | 2017/043607 | A1 | 3/2017 |

* cited by examiner

SILICON CARBIDE EPITAXIAL SUBSTRATE AND METHOD OF MANUFACTURING SILICON CARBIDE EPITAXIAL SUBSTRATE

TECHNICAL FIELD

The present disclosure relates to a silicon carbide epitaxial substrate and a method of manufacturing a silicon carbide epitaxial substrate. This application claims priority based on Japanese Patent Application No. 2020-114810 filed on Jul. 2, 2020. The entire contents of the Japanese patent application are incorporated herein by reference.

BACKGROUND ART

Japanese Unexamined Patent Application Publication No. 2014-138026 (PTL 1) discloses a silicon carbide semiconductor device having a p-type buried region.

PRIOR ART DOCUMENT

Patent Literature

PTL 1: Japanese Unexamined Patent Application Publication No. 2014-138026

SUMMARY OF INVENTION

A silicon carbide epitaxial substrate according to the present disclosure includes: a silicon carbide substrate; a first silicon carbide epitaxial layer disposed on the silicon carbide substrate; and a second silicon carbide epitaxial layer disposed on the first silicon carbide epitaxial layer. When an area density of first particles in the first silicon carbide epitaxial layer is defined as a first area density and an area density of second particles in the second silicon carbide epitaxial layer is defined as a second area density, a value determined by dividing the first area density by the second area density is more than 0.5 and less than 1. The first particles and the second particles each have a maximum diameter of 2 μm to 50 μm.

A method of manufacturing a silicon carbide epitaxial substrate according to the present disclosure includes the following steps: forming a first silicon carbide epitaxial layer on a silicon carbide substrate in a first reaction chamber at a first temperature; removing the silicon carbide substrate on which the first silicon carbide epitaxial layer is formed, from the first reaction chamber, disposing the silicon carbide substrate on which the first silicon carbide epitaxial layer is formed in a second reaction chamber; heating the silicon carbide substrate on which the first silicon carbide epitaxial layer is formed, in the second reaction chamber at a second temperature while allowing a gas to flow; and forming a second silicon carbide epitaxial layer on the first silicon carbide epitaxial layer in the second reaction chamber. The second temperature is lower than the first temperature.

BRIEF DESCRIPTION OF DRAWINGS

FIG. 9 is a schematic cross-sectional view showing a first step of the method of manufacturing the silicon carbide epitaxial substrate according to the embodiment of the present disclosure.

DETAILED DESCRIPTION

Figure 1:
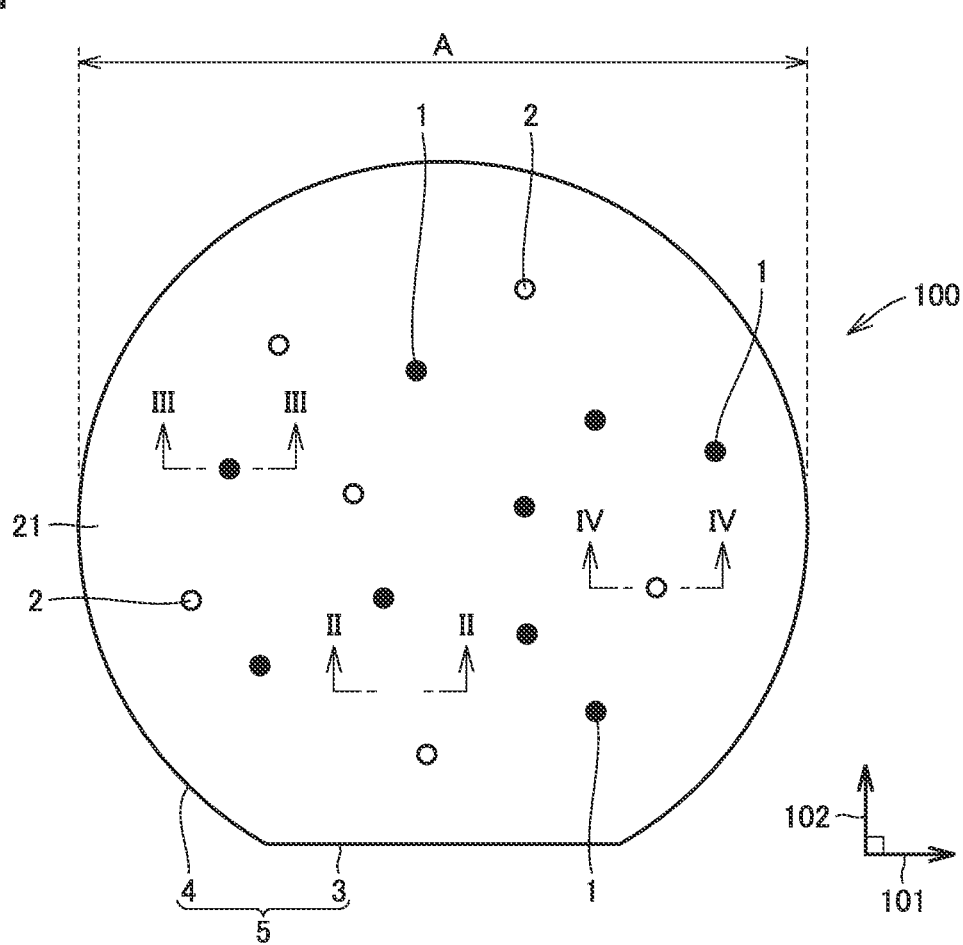
FIG. 1 is a schematic plan view showing the structure of a silicon carbide epitaxial substrate according to a first embodiment.

Problems to be Solved by the Present Disclosure

An object of the present disclosure is to provide a silicon carbide epitaxial substrate and a method of manufacturing the silicon carbide epitaxial substrate capable of suppressing deterioration of a breakdown voltage of a silicon carbide semiconductor device.

Effects of the Present Disclosure

According to the present disclosure, it is possible to provide a silicon carbide epitaxial substrate and a method of manufacturing the silicon carbide epitaxial substrate capable of suppressing deterioration of a breakdown voltage of a silicon carbide semiconductor device.

Summary of Embodiments of the Present Disclosure

First, an outline of embodiments of the present disclosure will be described. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "-" (bar) above a numeral but is indicated by putting the negative sign before the numeral in the present specification.

(1) A silicon carbide epitaxial substrate 100 according to the present disclosure includes: a silicon carbide substrate 30; a first silicon carbide epitaxial layer 10 disposed on silicon carbide substrate 30; and a second silicon carbide epitaxial layer 20 disposed on first silicon carbide epitaxial layer 10. When an area density of first particles 1 in first silicon carbide epitaxial layer 10 is defined as a first area density and an area density of second particles 2 in second silicon carbide epitaxial layer 20 is defined as a second area density, a value determined by dividing the first area density by the second area density is more than 0.5 and less than 1. First particles 1 and second particles 2 each have a maximum diameter of 2 μm to 50 μm.

(2) In silicon carbide epitaxial substrate 100 according to (1), the second area density may be less than 10 cm$^{-2}$.

(3) In silicon carbide epitaxial substrate 100 according to (1) or (2), first silicon carbide epitaxial layer 10 may include a first region 13 having a first conductivity type and a second region 14 in contact with first region 13 and having a second conductivity type different from the first conductivity type.

(4) In silicon carbide epitaxial substrate 100 according to (3), in a direction perpendicular to a boundary surface between first silicon carbide epitaxial layer 10 and second silicon carbide epitaxial layer 20, second region 14 may have a thickness of 1 μm or less.

(5) In silicon carbide epitaxial substrate 100 according to (1) or (2), first silicon carbide epitaxial layer 10 may have a first conductivity type, and second silicon carbide epitaxial layer 20 may have a second conductivity type different from the first conductivity type.

(6) A method of manufacturing a silicon carbide epitaxial substrate 100 according to the present disclosure includes the following steps: forming a first silicon carbide epitaxial layer 10 on a silicon carbide substrate 30 in a first reaction chamber 51 at a first temperature; removing silicon carbide substrate 30 on which first silicon carbide epitaxial layer 10 is formed, from first reaction chamber 51; disposing silicon carbide substrate 30 on which first silicon carbide epitaxial layer 10 is formed, in a second reaction chamber 52; heating silicon carbide substrate 30 on which first silicon carbide epitaxial layer 10 is formed, in second reaction chamber 52 and at a second temperature while allowing a gas to flow; and forming a second silicon carbide epitaxial layer 20 on first silicon carbide epitaxial layer 10 in second reaction chamber 52. The second temperature is lower than the first temperature.

(7) In the method of manufacturing silicon carbide epitaxial substrate 100 according to (6), the second temperature may be 1,500° C. or lower.

(8) In the method of manufacturing silicon carbide epitaxial substrate 100 according to (6) or (7), a flow velocity of the gas may be 15 cm/second to 200 cm/second under conditions of a temperature of 300 K and a pressure of 1 atmospheric pressure.

(9) In the method of manufacturing silicon carbide epitaxial substrate 100 according to any one of (6) to (8), first reaction chamber 51 may be the same as second reaction chamber 52.

(10) In the method of manufacturing silicon carbide epitaxial substrate 100 according to any one of (6) to (8), first reaction chamber 51 may be different from second reaction chamber 52.

Details of Embodiments of Present Disclosure

Hereinafter, embodiments of the present disclosure will be described in detail. In the following description, the same or corresponding elements are denoted by the same reference numerals, and the same description thereof will not be repeated.

First Embodiment

Figure 2:
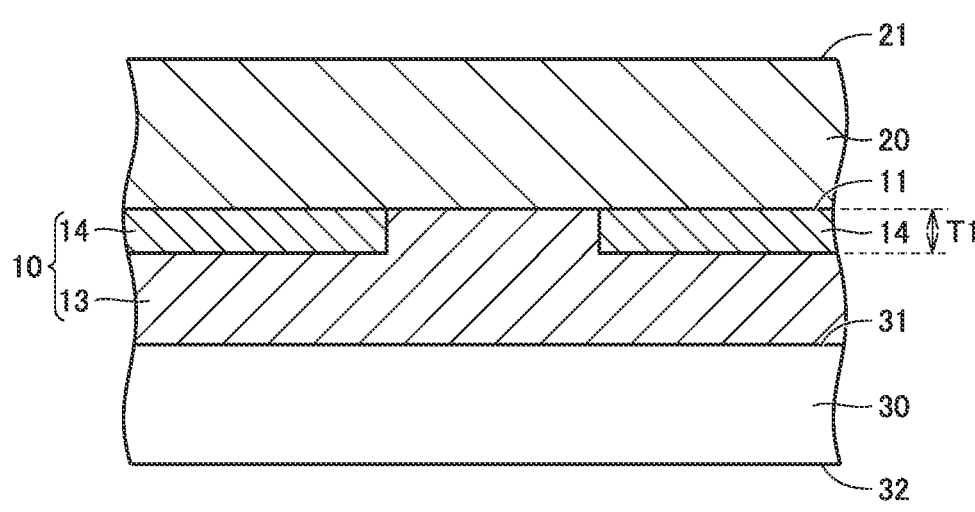
FIG. 2 is a schematic cross-sectional view taken along a line II-II of FIG. 1.

First, a configuration of a silicon carbide epitaxial substrate according to a first embodiment will be described. FIG. 1 is a schematic plan view showing the structure of the silicon carbide epitaxial substrate according to the first embodiment. FIG. 2 is a schematic cross-sectional view taken along a line II-II of FIG. 1.

As shown in FIGS. 1 and 2, a silicon carbide epitaxial substrate 100 according to the first embodiment includes a silicon carbide substrate 30, a first silicon carbide epitaxial layer 10, and a second silicon carbide epitaxial layer 20. First silicon carbide epitaxial layer is disposed on silicon carbide substrate 30. Second silicon carbide epitaxial layer 20 is disposed on first silicon carbide epitaxial layer 10. First silicon carbide epitaxial layer 10 is located between silicon carbide substrate 30 and second silicon carbide epitaxial layer 20. Second silicon carbide epitaxial layer 20 forms a surface (first main surface 21) of silicon carbide epitaxial substrate 100.

As shown in FIG. 1, when viewed in a direction perpendicular to first main surface 21, first main surface 21 has an outer circumferential edge 5. Outer circumferential edge 5 has, for example, an orientation flat 3 and an arc-shaped portion 4. Orientation flat 3 extends along a first direction 101. As shown in FIG. 1, orientation flat 3 is linear when viewed in the direction perpendicular to first main surface 21. Arc-shaped portion 4 is contiguous to orientation flat 3. Arc-shaped portion 4 is arc-shaped when viewed in the direction perpendicular to first main surface 21.

As shown in FIG. 1, when viewed in the direction perpendicular to first main surface 21, first main surface 21 extends along each of first direction 101 and a second direction 102. When viewed in the direction perpendicular to first main surface 21, first direction 101 is a direction perpendicular to second direction 102.

First direction 101 is, for example, a <11-20> direction. First direction 101 may be, for example, a [11-20] direction. First direction 101 may be a direction obtained by projecting the <11-20> direction onto first main surface 21. From another viewpoint, first direction 101 may be, for example, a direction including a <11-20> direction component.

Second direction 102 is, for example, a <1-100> direction. Second direction 102 may be, for example, a [1-100] direction. Second direction 102 may be, for example, a direction obtained by projecting the <1-100> direction onto first main surface 21. From another viewpoint, second direction 102 may be, for example, a direction including a <1-100> direction component.

First main surface 21 may be a surface inclined with respect to a {0001} plane. When first main surface 21 is inclined with respect to the {0001} plane, an inclination angle (off angle) with respect to the {0001} plane is, for example, 2° to 6°. When first main surface 21 is inclined with respect to the {0001} plane, the inclination direction (off direction) of first main surface 21 is, for example, the <11-20> direction.

As shown in FIG. 1, a maximum diameter A of first main surface 21 is not particularly limited, but is, for example, 100 mm (4 inches). Maximum diameter A may be 125 mm (5 inches) or more, or 150 mm (6 inches) or more. The upper limit of maximum diameter A is not particularly limited. Maximum diameter A may be, for example, 200 (8 inches) mm or less. Maximum diameter A is the longest linear distance between two different points on outer circumferential edge 5.

As used herein, 2 inches refers to 50 mm or 50.8 mm (2 inches×25.4 mm/inch). 4 inches refers to 100 mm or 101.6 mm (4 inches×25.4 mm/inch). 5 inches refers to 125 mm or 127.0 mm (5 inches×25.4 mm/inch). 6 inches refers to 150 mm or 152.4 mm (6 inches×25.4 mm/inch). 8 inches refers to 200 mm or 203.2 mm (8 inches×25.4 mm/inch).

As shown in FIG. 2, silicon carbide substrate 30 has a third main surface 31 and a second main surface 32. Second main surface 32 is a surface opposite to third main surface 31. Second main surface 32 constitutes a backside surface of silicon carbide epitaxial substrate 100. Third main surface 31 is in contact with first silicon carbide epitaxial layer 10. The polytype of silicon carbide constituting silicon carbide substrate 30 is, for example, 4H. The polytype of silicon carbide constituting first silicon carbide epitaxial layer 10 is, for example, 4H. The polytype of silicon carbide constituting second silicon carbide epitaxial layer 20 is, for example, 4H.

Silicon carbide substrate 30 contains an n-type impurity such as nitrogen (N). The conductivity type of silicon carbide substrate 30 is, for example, n-type (first conductivity type). The thickness of silicon carbide substrate 30 is, for example, 350 μm to 500 μm. Second silicon carbide epitaxial layer 20 contains an n-type impurity such as nitrogen. The conductivity type of second silicon carbide epitaxial layer 20 is, for example, n-type. The concentration of the n-type impurity included in second silicon carbide epitaxial layer 20 may be lower than the concentration of the n-type impurity included in silicon carbide substrate 30.

As shown in FIG. 2, first silicon carbide epitaxial layer 10 has a first region 13 and a second region 14. First region 13 has, for example, an n-type (first conductivity type). First region 13 contains an n-type impurity such as nitrogen. The concentration of the n-type impurity included in first region 13 may be lower than the concentration of the n-type impurity included in silicon carbide substrate 30. Second region 14 has a p-type (second conductivity type) different from an n-type (first conductivity type). Second region 14 contains a p-type impurity such as aluminum. The concentration of the p-type impurity contained in second region 14 may be higher than the concentration of the n-type impurity contained in first region 13.

First region 13 is provided on silicon carbide substrate 30. First region 13 is in contact with each of silicon carbide substrate 30 and second silicon carbide epitaxial layer 20. First region 13 constitutes a part of a boundary surface 11 between first silicon carbide epitaxial layer 10 and second silicon carbide epitaxial layer 20. First region 13 is in contact with second region 14.

Second region 14 is in contact with second silicon carbide epitaxial layer 20. Second region 14 is separated from silicon carbide substrate 30. Second region 14 constitutes a part of boundary surface 11 between first silicon carbide epitaxial layer 10 and second silicon carbide epitaxial layer 20. In a direction perpendicular to boundary surface 11 between first silicon carbide epitaxial layer 10 and second silicon carbide epitaxial layer 20, a thickness (a first thickness T1) of second region 14 is, for example, 1 μm or less. First thickness T1 may be 0.8 μm or less, or 0.5 μm or less. The lower limit of first thickness T1 is not particularly limited, but may be 0.1 μm or more, for example.

Figure 3:
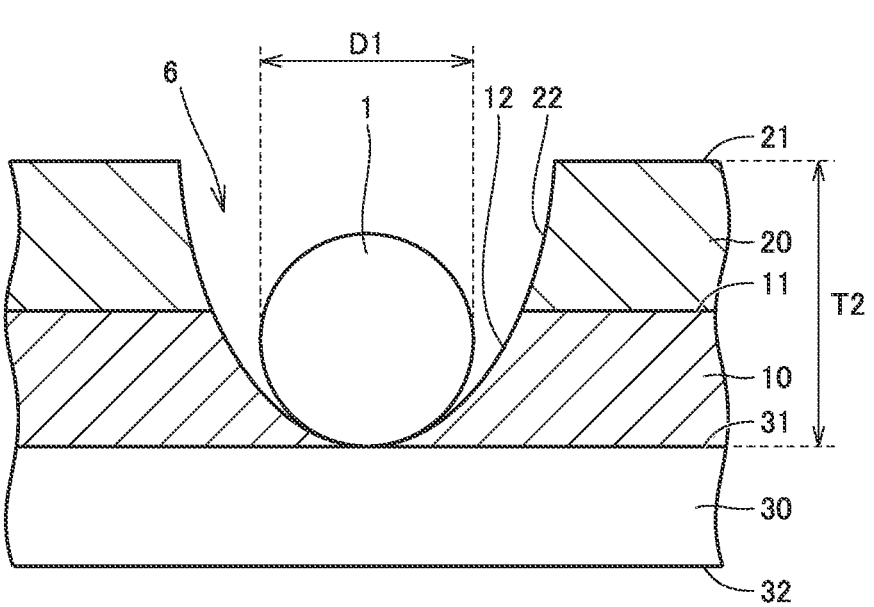
FIG. 3 is a schematic cross-sectional view taken along a line III-III of FIG. 1.

FIG. 3 is a schematic cross-sectional view taken along a line III-III of FIG. 1. As shown in FIG. 3, silicon carbide epitaxial substrate 100 has a first particle 1. First particle 1 is in first silicon carbide epitaxial layer 10. The bottom of first particle 1 may be in contact with silicon carbide substrate 30. When viewed in a direction perpendicular to second main surface 32, first particle 1 is surrounded by first silicon carbide epitaxial layer 10. When viewed in a direction perpendicular to second main surface 32, a part of first particle 1 may be surrounded by second silicon carbide epitaxial layer 20.

A first recess 6 is provided on first main surface 21 of silicon carbide epitaxial substrate 100. First particle 1 is inside a first recess 6. First silicon carbide epitaxial layer has a first side surface 12 connecting between boundary surface 11 and third main surface 31. Second silicon carbide epitaxial layer 20 has a second side surface 22 connecting between boundary surface 11 and first main surface 21. Second side surface 22 may be contiguous to first side surface 12. First recess 6 is composed of, for example, first side surface 12, second side surface 22, and third main surface 31.

When viewed in a direction perpendicular to second main surface 32, first side surface 12 surrounds first particle 1. A part of first side surface 12 may be in contact with first particle 1 or may be separated from first particles 1. When viewed in the direction perpendicular to second main surface 32, second side surface 22 surrounds first particle 1. Second side surface 22 may be separated from first particle 1. A part of first particle 1 may protrude from first recess 6. A maximum diameter (first maximum diameter D1) of first particle 1 when viewed in the direction perpendicular to second main surface 32 may be greater than a total thickness (second thickness T2) of first silicon carbide epitaxial layer and second silicon carbide epitaxial layer 20. The depth of first recess 6 is equal to second thickness T2. The maximum diameter (first maximum diameter D1) of first particles 1 may be larger or smaller than the depth of first recess 6.

First maximum diameter D1 is 2 μm to 50 μm. The upper limit of first maximum diameter D1 may be 45 μm or less, or 40 μm or less. The lower limit of first maximum diameter D1 may be 4 μm or more, or 6 μm or more.

Figure 4:
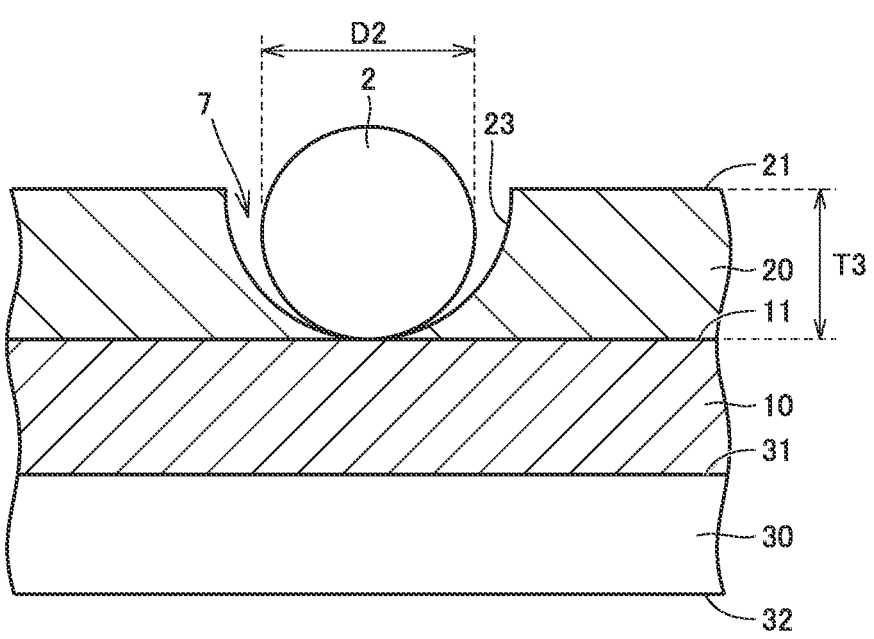
FIG. 4 is a schematic cross-sectional view taken along a line IV-IV of FIG. 1.

FIG. 4 is a schematic cross-sectional view taken along a line IV-IV of FIG. 1. As shown in FIG. 4, silicon carbide epitaxial substrate 100 has a second particle 2. Second particle 2 is in second silicon carbide epitaxial layer 20. A bottom of second particle 2 may be in contact with first silicon carbide epitaxial layer 10. Second particle 2 is separated from silicon carbide substrate 30. When viewed in the direction perpendicular to second main surface 32, second particle 2 is surrounded by second silicon carbide epitaxial layer 20. First silicon carbide epitaxial layer 10 is located between second particle 2 and silicon carbide substrate 30. In other words, second particle 2 is located close to first main surface 21 with respect to boundary surface 11 in the direction perpendicular to second main surface 32.

A second recess 7 is provided on first main surface 21 of silicon carbide epitaxial substrate 100. Second particle 2 is inside a second recess 7. Second silicon carbide epitaxial layer 20 has a third side surface 23 connecting between boundary surface 11 and first main surface 21. Second recess 7 is composed of, for example, third side surface 23 and boundary surface 11.

When viewed in the direction perpendicular to second main surface 32, third side surface 23 surrounds second particle 2. A part of third side surface 23 may be in contact with second particle 2 or may be separated from second particle 2. A part of second particle 2 may protrude from second recess 7. A maximum diameter (second maximum diameter D2) of second particles 2 when viewed in the direction perpendicular to second main surface 32 may be greater than a thickness (third thickness T3) of second silicon carbide epitaxial layer 20. The depth of second recess 7 is the same as third thickness T3. The maximum diameter (second maximum diameter D2) of second particle 2 may be larger or smaller than the depth of second recess 7.

Second maximum diameter D2 is 2 μm to 50 μm. The upper limit of second maximum diameter D2 may be 45 μm or less, or 40 μm or less. The lower limit of second maximum diameter D2 may be 4 μm or more, or 6 μm or more.

Each of first particle 1 and second particle 2 is, for example, a downfall. The downfall is caused by the deposit deposited on the inner wall of the CVD apparatus dropping onto silicon carbide substrate 30. The downfall is, for example, polycrystalline silicon carbide, carbon, or tantalum carbide (TaC).

In silicon carbide epitaxial substrate 100 according to the embodiment of the present disclosure, when an area density of first particles 1 in first silicon carbide epitaxial layer 10 is defined as a first area density and an area density of second particles 2 in second silicon carbide epitaxial layer 20 is defined as a second area density, a value (density ratio) determined by dividing the first area density by the second area density is more than 0.5 and less than 1. The lower limit of the density ratio is not particularly limited, and may be 0.6 or more, or 0.7 or more.

The second area density is, for example, less than 10 cm². The second area density may be, for example, less than 5 cm⁻² or less than 2 cm². The lower limit of the second area density is not particularly limited, and may be, for example, 0.01 cm⁻² or more.

Second Embodiment

Next, a configuration of silicon carbide epitaxial substrate 100 according to the second embodiment will be described. The configuration of silicon carbide epitaxial substrate 100 according to the second embodiment is different from the configuration of silicon carbide epitaxial substrate 100 according to the first embodiment in that first silicon carbide epitaxial layer 10 has a first conductivity type and second silicon carbide epitaxial layer 20 has a second conductivity type, and other configurations are the same as those of silicon carbide epitaxial substrate 100 according to the first embodiment.

Figure 5:
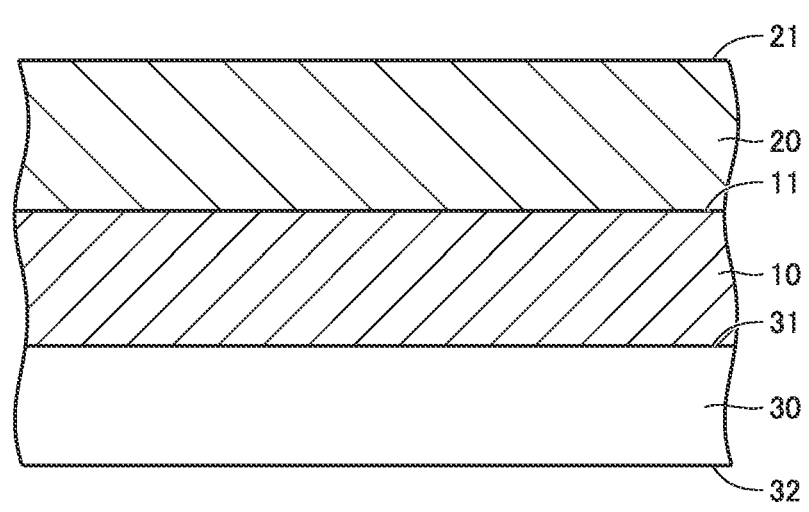
FIG. 5 is a schematic cross-sectional view showing the structure of a silicon carbide epitaxial substrate according to a second embodiment.

FIG. 5 is a schematic cross-sectional view showing the structure of the silicon carbide epitaxial substrate according to the second embodiment. The view of FIG. 5 corresponds to the schematic cross-sectional view taken along line II-II of FIG. 1.

First silicon carbide epitaxial layer 10 has an n-type (first conductivity type). First silicon carbide epitaxial layer 10 contains an n-type impurity such as nitrogen. The concentration of the n-type impurity included in first silicon carbide epitaxial layer 10 may be lower than the concentration of the n-type impurity included in silicon carbide substrate 30.

Second silicon carbide epitaxial layer 20 has a p-type (second conductivity type) different from an n-type (first conductivity type). Second silicon carbide epitaxial layer 20 contains a p-type impurity such as aluminum. Second silicon carbide epitaxial layer 20 is provided on first silicon carbide epitaxial layer 10.

Measurement Method for First Particles and Second Particles

Next, a measurement method for first particles 1 and second particles 2 will be described.

First particles 1 and second particles 2 can be specified by observing the surface (first main surface 21) of second silicon carbide epitaxial layer 20 using a defect inspection apparatus equipped with a confocal differential interference microscope, for example. As example, WASAVI series "SICA 6X" manufactured by Lasertec Corporation can be used as the defect inspection apparatus equipped with the confocal differential interference microscope. The magnification of the objective lens is 10 times, for example. The threshold value of the detection sensitivity of the defect inspection apparatus is determined using a standard sample. A downfall defect is defined in advance in consideration of a typical planar shape, dimensions, and the like of the downfall defect. Based on the observed images, the locations and number of defects that satisfy the definition of the downfall defect are identified.

While moving silicon carbide epitaxial substrate 100 in a direction parallel to the surface (first main surface 21) of second silicon carbide epitaxial layer 20, a confocal differential interference microscope image of entire first main surface 21 is captured. In the acquired confocal differential interference microscope image, both first particles 1 and second particles 2 are observed. In the acquired confocal differential interference microscope image, the total number of first particles 1 and second particles 2 is determined.

Next, second silicon carbide epitaxial layer 20 is removed. Specifically, first main surface 21 of second silicon carbide epitaxial layer 20 is polished. In this case, second particles 2 are also removed by polishing together with second silicon carbide epitaxial layer 20. As a result, first silicon carbide epitaxial layer 10 and silicon carbide substrate 30 remain. First particles 1 in first silicon carbide epitaxial layer 10 may be removed by the polishing.

Next, while moving silicon carbide epitaxial substrate 100 in a direction parallel to boundary surface 11 of first silicon carbide epitaxial layer 10, a confocal differential interference microscope image of entire boundary surface 11 is captured. In the acquired confocal differential interference microscope image, remaining first particles 1 and first recesses 6 in which first particles 1 existed are observed. In the acquired confocal differential interference contrast microscope image, the total number of remaining first particles 1 and first recesses 6 in which first particles 1 existed is specified. The total number of remaining first particles 1 and first recesses 6 in which first particles 1 existed is estimated as the number of first particles 1 existed before the polishing. A value obtained by subtracting the number of first particles 1 from the total number of first particles 1 and second particles 2 is the number of second particles 2. A value obtained by dividing the number of each of first particles 1 and second particles 2 by the measurement area is defined as the area density. The measurement region is first main surface 21 excluding the outer peripheral region within the 3 mm from outer circumferential edge 5.

Manufacturing Apparatus for Silicon Carbide Epitaxial Substrate

Next, a configuration of a manufacturing apparatus 200 for silicon carbide epitaxial substrate 100 will be described.

Figure 6:
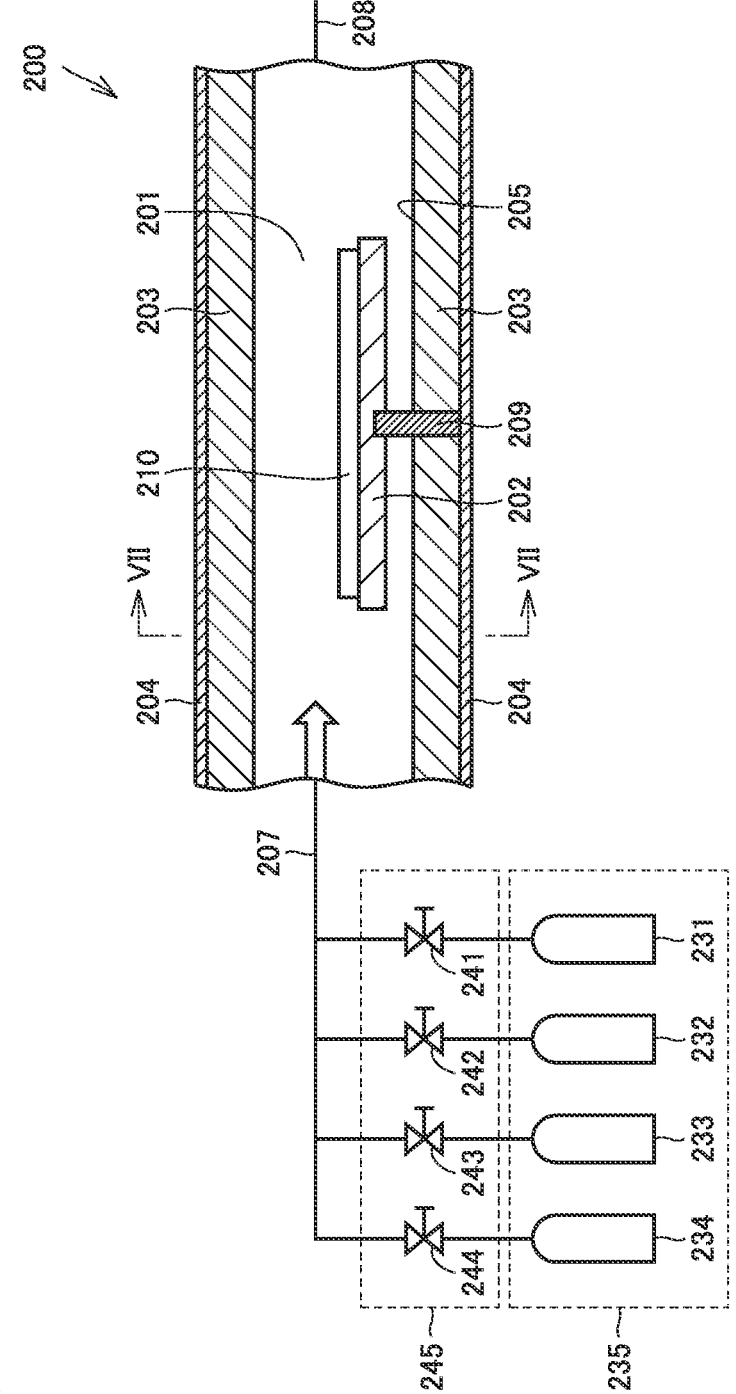
FIG. 6 is a partial cross-sectional schematic view showing the structure of a manufacturing apparatus for a silicon carbide epitaxial substrate.

FIG. 6 is a partial cross-sectional schematic view showing the structure of the manufacturing apparatus for the silicon carbide epitaxial substrate. As shown in FIG. 6, manufacturing apparatus 200 for the silicon carbide epitaxial substrate is, for example, a hot-wall type lateral CVD (Chemical Vapor Deposition) apparatus. Manufacturing apparatus 200 mainly includes a reaction chamber 201, a gas supply unit 235, a controller 245, a heating element 203, a quartz tube 204, and an induction heating coil (not shown).

Heating element 203 has a cylindrical shape, for example, and forms reaction chamber 201 therein. Heating element 203 is, for example, made of graphite. An induction heating coil is wound around the outer peripheral surface of quartz tube 204, for example. The induction heating coil is configured to be supplied with an alternating current from an external power supply (not shown). Thus, heating element 203 is inductively heated. As a result, reaction chamber 201 is heated by heating element 203.

Reaction chamber 201 is a space surrounded by an inner wall surface 205 of heating element 203. Silicon carbide substrate 30 is disposed in reaction chamber 201. Reaction chamber 201 is configured to heat silicon carbide substrate 30. Reaction chamber 201 is provided with a susceptor 210 for holding silicon carbide substrate 30. Susceptor 210 is disposed on a stage 202. Stage 202 is configured to be rotatable on its axis by a rotational shaft 209. As stage 202 rotates, susceptor 210 rotates.

Manufacturing apparatus 200 further includes a gas inlet 207 and a gas outlet 208. Gas outlet 208 is connected to an exhaust pump (not shown). A white arrow in FIG. 6 indicate the gas flow. Gas is introduced into reaction chamber 201 through gas inlet 207 and exhausted through gas outlet 208. A pressure in reaction chamber 201 is adjusted in accordance with a balance between the amount of gas supplied and the amount of gas discharged.

Gas supply unit 235 is configured to supply a mixed gas containing, for example, silane, propane, ammonia, and hydrogen to reaction chamber 201. Specifically, gas supply unit 235 may include a first gas supply unit 231, a second gas supply unit 232, a third gas supply unit 233, and a carrier gas supply unit 234.

First gas supply unit 231 is configured to be capable of supplying a first gas. First gas supply unit 231 is, for example, a gas cylinder filled with the first gas. The first gas may be, for example, a propane ($C_3H_8$) gas. The first gas may be, for example, a methane ($CH_4$) gas, an ethane ($C_2H_6$) gas, an acetylene ($C_2H_2$) gas, or the like.

Second gas supply unit 232 is configured to be capable of supplying a second gas. Second gas supply unit 232 is, for example, a gas cylinder filled with the second gas. The second gas is, for example, a silane ($SiH_4$) gas. The second gas may be a mixed gas of silane gas and a gas other than silane.

Third gas supply unit 233 is configured to be capable of supplying a third gas. Third gas supply unit 233 is, for example, a gas cylinder filled with a third gas. The third gas is a doping gas containing N (nitrogen atom). An ammonia gas is more easily thermally decomposed than a nitrogen gas having a triple bond. By using the ammonia gas, improvement in in-plane uniformity of the carrier concentration can be expected.

Carrier gas supply unit 234 is configured to be capable of supplying a carrier gas such as hydrogen. Carrier gas supply unit 234 is, for example, a gas cylinder filled with hydrogen.

Controller 245 is configured to be able to control the flow rate of the mixed gas supplied from gas supply unit 235 to reaction chamber 201. Specifically, controller 245 may include a first gas flow rate controller 241, a second gas flow rate controller 242, a third gas flow rate controller 243, and a carrier gas flow rate controller 244. Each controller may be an MFC (Mass Flow Controller), for example. Controller 245 is disposed between gas supply unit 235 and gas inlet 207. In other words, controller 245 is disposed in a flow path connecting gas supply unit 235 and gas inlet 207.

Figure 7:
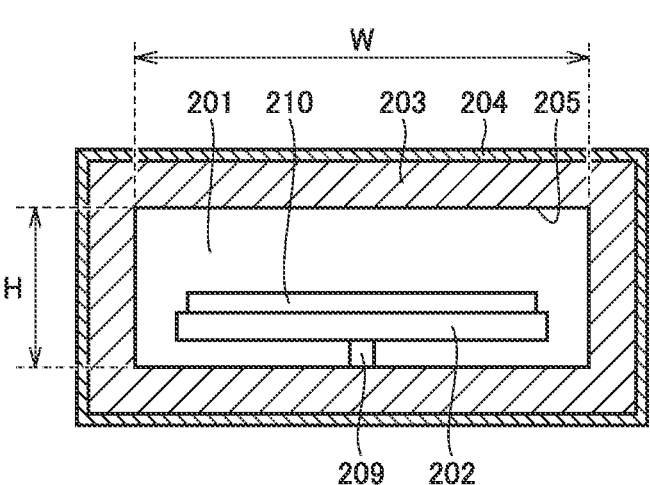
FIG. 7 is a schematic cross-sectional view taken along a line VII-VII of FIG. 6.

FIG. 7 is a schematic cross-sectional view taken along a line VII-VII of FIG. 6. As shown in FIG. 7, a region surrounded by inner wall surface 205 of heating element 203 has, for example, a substantially rectangular shape. A width W of the region surrounded by inner wall surface 205 of heating element 203 in a direction along the radial direction of silicon carbide substrate 30 may be greater than a height H of a region surrounded by inner wall surface 205 of heating element 203 in a direction perpendicular to the radial direction of silicon carbide substrate 30. The cross-sectional area of reaction chamber 201 is, for example, 50 cm². The lower limit of the cross-sectional area of reaction chamber 201 is not particularly limited, and may be, for example, 30 cm² or more, or 40 cm² or more. The upper limit of the cross-sectional area of reaction chamber 201 is not particularly limited, and may be, for example, 70 cm² or less, or 60 cm² or less. The cross-sectional area of reaction chamber 201 is an area (width W×height H) of the region surrounded by inner wall surface 205 of heating element 203 in a cross section perpendicular to the moving direction of the reaction gas (see FIG. 7).

Method of Manufacturing Silicon Carbide Epitaxial Substrate

Next, a method of manufacturing silicon carbide epitaxial substrate 100 according to the embodiment of the present disclosure will be described.

Figure 8:
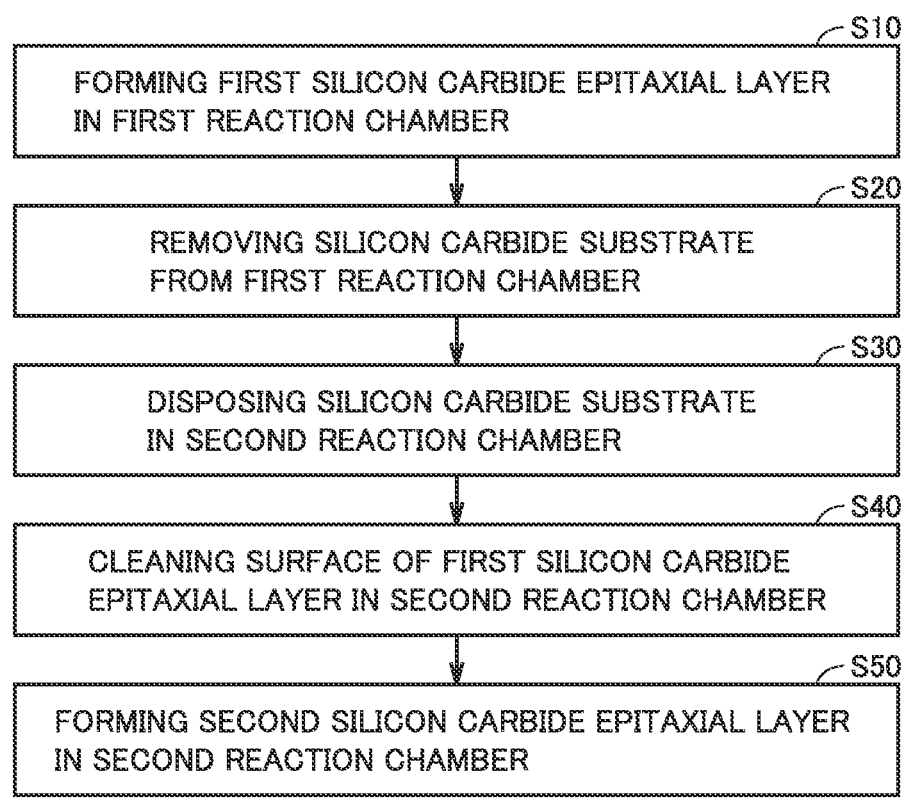
FIG. 8 is a flow chart showing an outline of a method of manufacturing the silicon carbide epitaxial substrate according to an embodiment of the present disclosure.

FIG. 8 is a flow chart schematically showing the method of manufacturing the silicon carbide epitaxial substrate according to the present embodiment. As shown in FIG. 8, the method of manufacturing silicon carbide epitaxial substrate 100 according to the present embodiment mainly includes: forming a first silicon carbide epitaxial layer in a first reaction chamber (S10); removing the silicon carbide substrate from the first reaction chamber (S20); disposing the silicon carbide substrate in a second reaction chamber (S30); cleaning a surface of the first silicon carbide epitaxial layer in the second reaction chamber (S40); and forming a second silicon carbide epitaxial layer in the second reaction chamber (S50).

First, silicon carbide substrate 30 is prepared. For example, a silicon carbide single crystal having a polytype 4H is produced by a sublimation method. Next, silicon carbide substrate 30 is prepared by slicing the silicon carbide single crystal with, for example, a wire saw. Silicon carbide substrate 30 contains an n-type impurity such as nitrogen. The conductivity type of silicon carbide substrate 30 is, for example, n-type.

Figure 9:
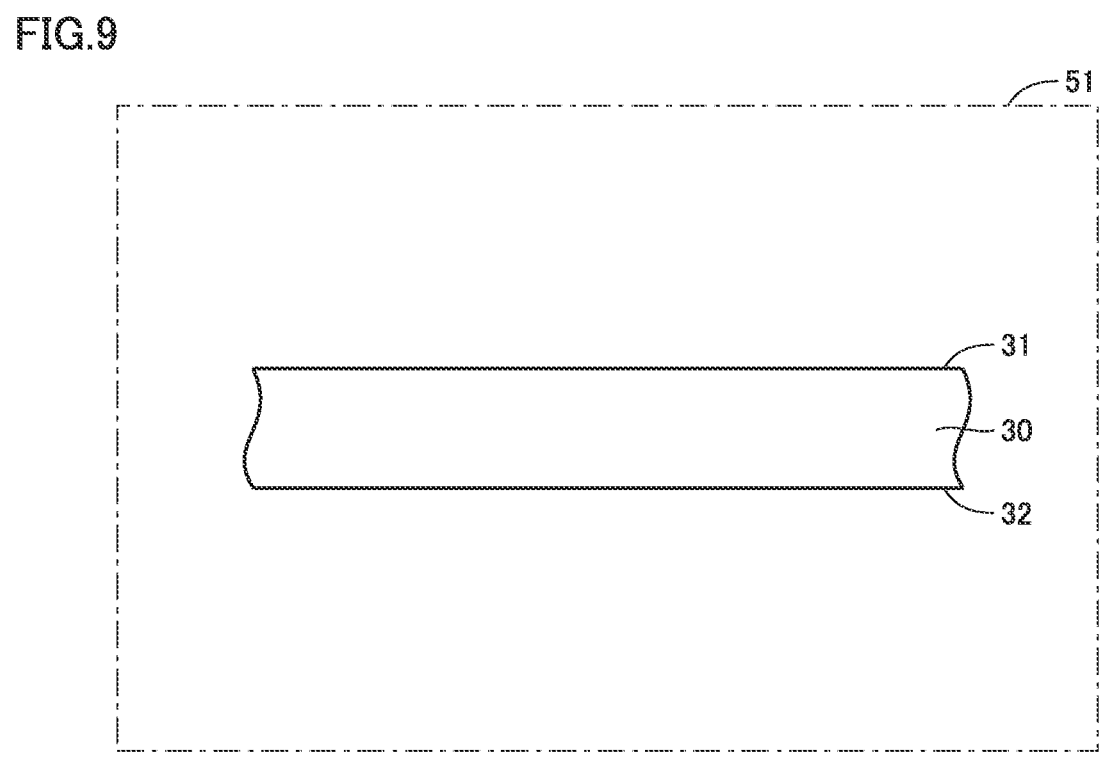

Next, the step (S10) of forming a first silicon carbide epitaxial layer in a first reaction chamber is performed. First, silicon carbide substrate 30 is disposed in first reaction chamber 51 (see FIG. 9). First reaction chamber 51 is, for example, reaction chamber 201 of the manufacturing apparatus shown in FIG. 6. Silicon carbide substrate 30 is placed on susceptor 210 (see FIG. 6). As shown in FIG. 9, silicon carbide substrate 30 has third main surface 31 and second main surface 32 opposite to third main surface 31. Third main surface 31 is, for example, a surface inclined in an off direction by an off angle with respect to the {0001} plane. The off angle is, for example, 2° to 6°. The off direction is, for example, the <11-20> direction. The maximum diameter of third main surface 31 is, for example, 150 mm.

Next, first reaction chamber 51 is reduced from atmospheric pressure to about $1 \times 10^{-6}$ Pa. Next, temperature rising of silicon carbide substrate 30 is started. During the temperature rising, a hydrogen ($H_2$) gas as a carrier gas is introduced into first reaction chamber 51 from carrier gas supply unit 234. The flow rate of the hydrogen gas is adjusted by carrier gas flow rate controller 244.

Figure 10:
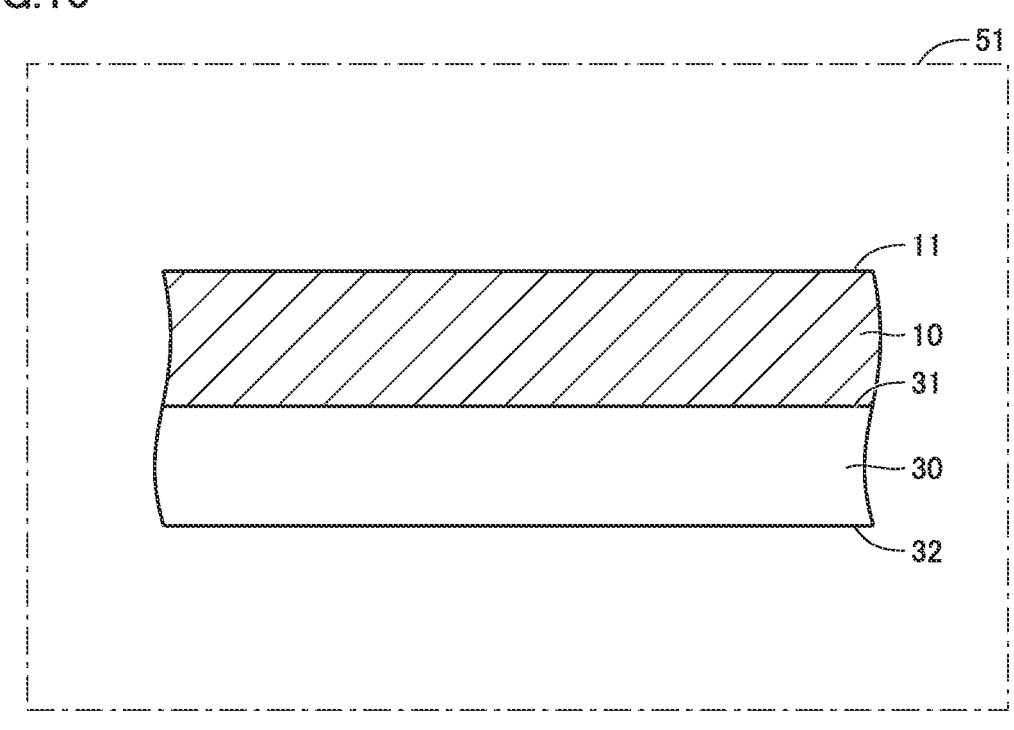
FIG. 10 is a schematic cross-sectional view showing a second step of the method of manufacturing the silicon carbide epitaxial substrate according to the embodiment of the present disclosure.

After the temperature of first reaction chamber 51 reaches, for example, about 1600° C., the source gas, the dopant gas, and the carrier gas are supplied to first reaction chamber 51. Specifically, by supplying a mixed gas containing silane, ammonia, hydrogen, and propane to reaction chamber 201, each gas is thermally decomposed. Thus, first silicon carbide epitaxial layer 10 is formed on silicon carbide substrate 30 at 1600° C. (first temperature) in first reaction chamber 51 (see FIG. 10).

Next, the step (S20) of removing the silicon carbide substrate from the first reaction chamber is performed. Specifically, silicon carbide substrate 30 on which first silicon carbide epitaxial layer 10 is formed is removed from first reaction chamber 51. Next, silicon carbide substrate 30 on which first silicon carbide epitaxial layer 10 is formed is disposed inside an ion implantation device 53.

Figure 11:
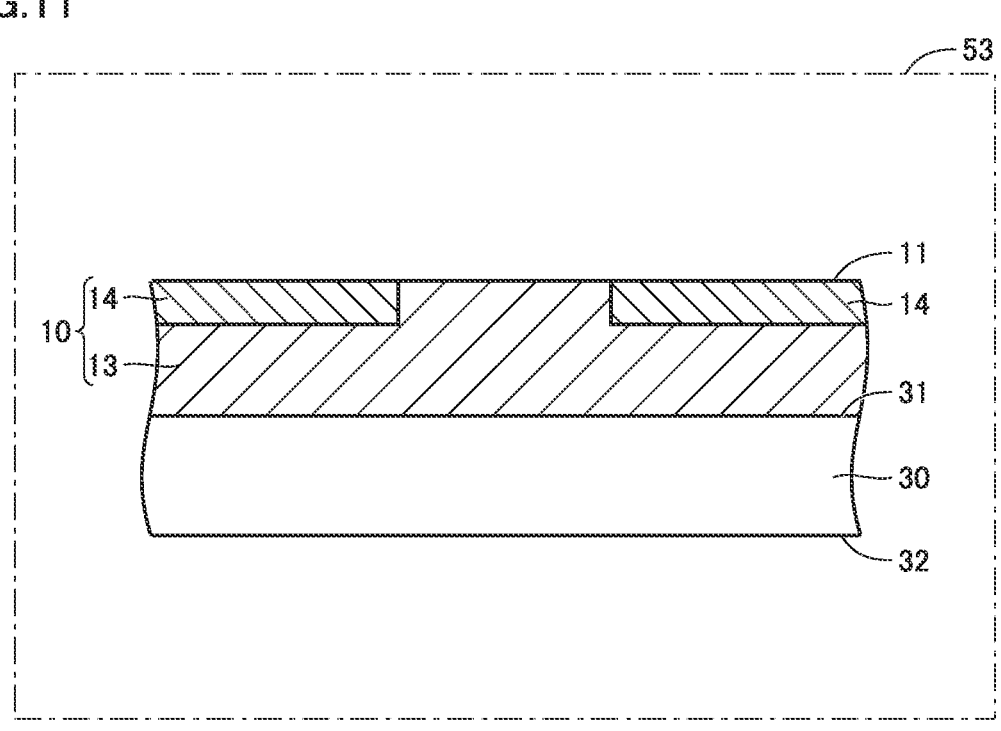
FIG. 11 is a schematic cross-sectional view showing a third step of the method of manufacturing the silicon carbide epitaxial substrate according to the embodiment of the present disclosure.

Next, a p-type region (second region 14) is formed in first silicon carbide epitaxial layer 10. Specifically, an implantation mask (not shown) having an opening is formed on first silicon carbide epitaxial layer 10. An impurity such as aluminum is ion-implanted into first silicon carbide epitaxial layer 10 using the implantation mask. Thus, a p-type region (second region 14) is formed in first silicon carbide epitaxial layer 10 (see FIG. 11). In first silicon carbide epitaxial layer 10, a region in which the p-type region (second region 14) is not formed becomes an n-type region (first region 13). First silicon carbide epitaxial layer includes first region 13 and second region 14. After the ion implantation step is completed, silicon carbide substrate 30 on which first silicon carbide epitaxial layer 10 is formed is removed from ion implantation device 53.

Next, the step (S30) of disposing the silicon carbide substrate in the second reaction chamber is performed. Silicon carbide substrate 30 on which first silicon carbide epitaxial layer 10 is formed is disposed in second reaction chamber 52. Second reaction chamber 52 is, for example, reaction chamber 201 of the manufacturing apparatus shown in FIG. 6. That is, first reaction chamber 51 may be the same as second reaction chamber 52. Alternatively, first reaction chamber 51 may be different from second reaction chamber 52. In other words, silicon carbide substrate 30 may be disposed in a reaction chamber of a CVD apparatus in which first silicon carbide epitaxial layer 10 is formed, or may be disposed in a reaction chamber of a CVD apparatus different from the CVD apparatus in which first silicon carbide epitaxial layer 10 is formed.

Figure 12:
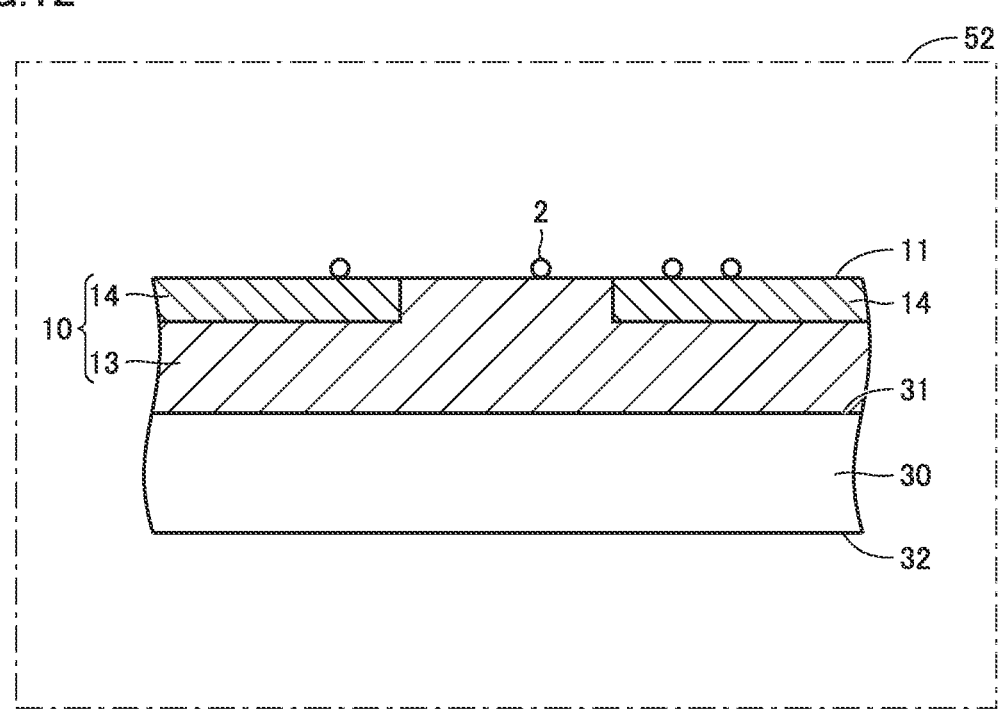
FIG. 12 is a schematic cross-sectional view showing a fourth step of the method of manufacturing the silicon carbide epitaxial substrate according to the embodiment of the present disclosure.

Next, the step (S40) of cleaning the surface of the first silicon carbide epitaxial layer in the second reaction chamber is performed. When silicon carbide substrate 30 on which first silicon carbide epitaxial layer 10 is formed is disposed in second reaction chamber 52, the downfall (second particles 2) existing in second reaction chamber 52 may be attached to a surface of first silicon carbide epitaxial layer 10 (see FIG. 12). In order to remove such a downfall, the surface (boundary surface 11) of first silicon carbide epitaxial layer 10 is cleaned.

Specifically, silicon carbide substrate 30 on which first silicon carbide epitaxial layer 10 is formed is heated at a second temperature while allowing a gas to flow in second reaction chamber 52. In order to suppress sublimation of the p-type region (second region 14) formed in first silicon carbide epitaxial layer 10, the cleaning temperature is set to be low. Specifically, the second temperature is lower than the first temperature. The second temperature is, for example, 1500° C. or less. The second temperature may be, for example, 1300° C. or lower, 1099° C. or lower, or 999° C. or lower. Accordingly, the sublimation of the p-type region (second region 14) can be further suppressed.

Further, in order to effectively remove the downfall attached to the surface of first silicon carbide epitaxial layer 10, the flow velocity of the gas is set to be high. The flow velocity of the gas is a value obtained by dividing the flow rate of the gas introduced into second reaction chamber 52 by the cross-sectional area of second reaction chamber 52 in a cross section perpendicular to the direction in which the gas flows. The flow velocity of the gas is, for example, 15 cm/second or more under standard conditions of a temperature (300 K) and a pressure (1 atmospheric pressure). The flow velocity of the gas may be 10 cm/second or more, or 30 cm/second or more. The upper limit of the flow velocity of the gas is, for example, 200 cm/second or less. The upper limit of the flow velocity of the gas is not particularly limited, and may be, for example, 150 cm/second or less, or may be, for example, 100 cm/second or less. It is preferable that the flow velocity of the gas is not excessively high from the viewpoint of suppressing breakage of the member and from the viewpoint of suppressing generation of a dust source.

The cross-sectional area of second reaction chamber 52 is a gas channel cross-sectional area. As shown in FIG. 7, since height H of second reaction chamber 52 is 20 mm and width W of second reaction chamber 52 is 250 mm, then the cross-sectional area of second reaction chamber 52 is 20 mm×250 mm=5000 mm²=50 cm². The flow rate of the gas is, for example, 100 slm=100×1000 cm³/60 seconds=1666 cm³/second. In this case, the value obtained by dividing the flow rate of the gas by the cross-sectional area of second reaction chamber 52 (i.e., the flow velocity of the gas) is (1666 cm³/second)/(50 cm²)=33.3 cm/second. It should be noted that the flow velocity of the gas increases when the temperature increases or the pressure decreases relative to the standard conditions of a temperature (300 K) and a pressure (1 atmospheric pressure).

The gas is, for example, a hydrogen gas. The gas may be, for example, a noble gas. The gas may be, for example, an argon gas, a helium gas, or a nitrogen gas. From another point of view, the gas preferably includes any of argon, helium, hydrogen, and nitrogen.

Next, the step (S50) of forming the second silicon carbide epitaxial layer in the second reaction chamber is performed.

Figure 13:
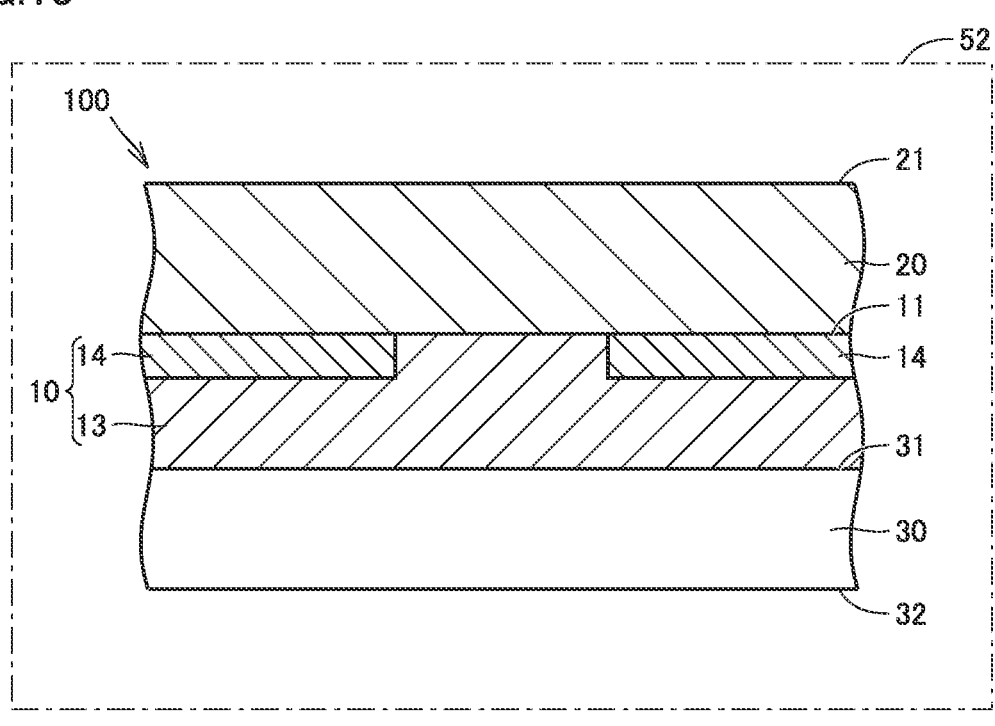
FIG. 13 is a schematic cross-sectional view showing a fifth step of the method of manufacturing the silicon carbide epitaxial substrate according to the embodiment of the present disclosure.

As shown in FIG. 13, second silicon carbide epitaxial layer 20 is formed on first silicon carbide epitaxial layer 10 in second reaction chamber 52. Specifically, after the temperature of second reaction chamber 52 reaches, for example, about 1600° C., the source gas, the dopant gas, and the carrier gas are supplied to second reaction chamber 52. By supplying a mixed gas containing silane, ammonia, hydrogen, and propane to reaction chamber 201, each gas is thermally decomposed. Thus, second silicon carbide epitaxial layer 20 is formed on first silicon carbide epitaxial layer 10 at a third temperature higher than the second temperature. The third temperature is, for example, 1600° C. Thus, silicon carbide epitaxial substrate 100 (FIG. 2) according to the embodiment of the present disclosure is manufactured.

Method of Manufacturing Silicon Carbide Semiconductor Device

Next, a method of manufacturing a silicon carbide semiconductor device will be described. The silicon carbide semiconductor device is, for example, a MOSFET (Metal Oxide Semiconductor Field Effect Transistor).

Figure 14:
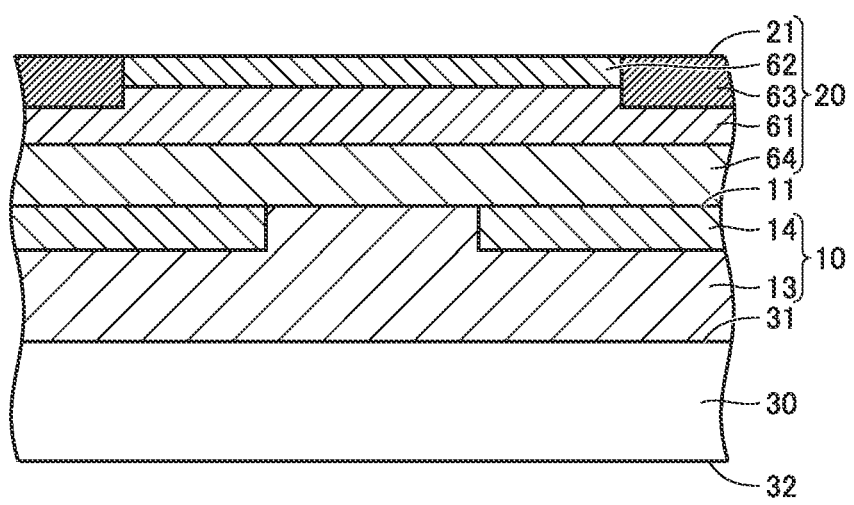
FIG. 14 is a schematic cross-sectional view showing a first step of a method of manufacturing a silicon carbide semiconductor device according to the embodiment of the present disclosure.

First, silicon carbide epitaxial substrate 100 (see FIG. 2) is prepared. Next, an impurity such as aluminum is ion-implanted into second silicon carbide epitaxial layer 20 to form a body region 61. Next, an impurity such as phosphorus is ion-implanted into body region 61 at a depth shallower than that of body region 61 to form a source region 62. Next, an impurity such as aluminum is ion-implanted into source region 62 to form a contact region 63 (see FIG. 14).

Next, heat treatment (activation annealing) is performed to activate the ion-implanted impurities. A temperature of the activation annealing is preferably 1500° C. to 1900° C., for example, about 1700° C. An activation annealing time is, for example, about 30 minutes. An atmosphere of the activation annealing is preferably an inert gas atmosphere, for example, an Ar atmosphere.

Next, a trench TR is formed in first main surface 21 of silicon carbide substrate 30. Specifically, a mask layer (not shown) having an opening is formed on first main surface 21. Next, in the opening of the mask layer, source region 62, body region 61, and a part of a drift region 64 are removed by etching. As an etching method, for example, reactive ion etching, particularly inductively coupled plasma reactive ion etching can be used. For example, inductively coupled plasma reactive ion etching using $SF_6$ or a mixture gas of $SF_6$ and $O_2$ as a reactive gas can be used.

Next, thermal etching is performed. The thermal etching can be performed, for example, by heating in an atmosphere containing a reactive gas having at least one or more halogen atoms. The at least one or more types of halogen atoms include at least one of chlorine (Cl) atoms and fluorine (F) atoms. The atmosphere is, for example, $Cl_2$, $BCl_3$, $SF_6$, or $CF_4$. For example, thermal etching is performed by using a mixed gas of chlorine gas and oxygen gas as a reaction gas and setting the heat treatment temperature to, for example, 700° C. to 1000° C.

Figure 15:
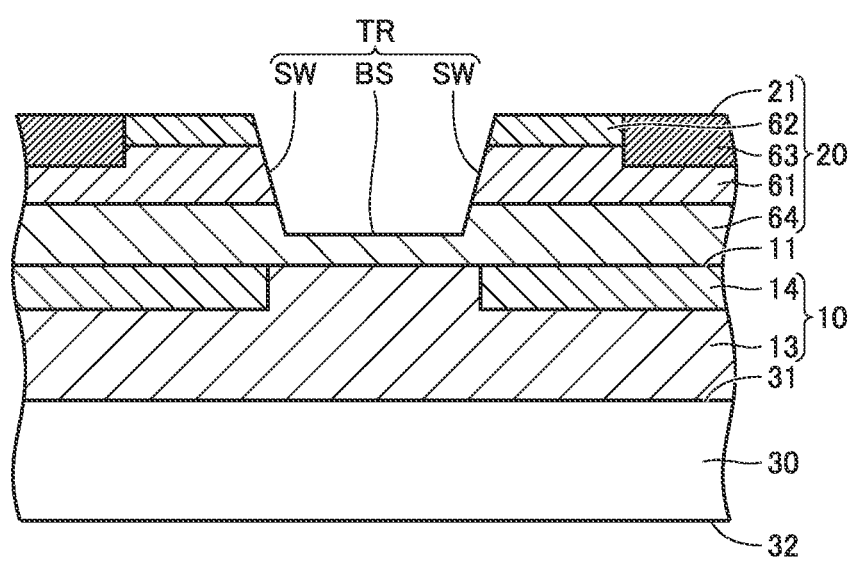
FIG. 15 is a schematic cross-sectional view showing a second step of the method of manufacturing the silicon carbide semiconductor device according to the embodiment of the present disclosure.

As shown in FIG. 15, trench TR is formed in first main surface 21 of silicon carbide epitaxial substrate 100 by the thermal etching described above. Trench TR is formed by a side portion SW extending to drift region 64 through source region 62 and body region 61, and a bottom portion BS located on drift region 64. Preferably, side portion SW of trench TR is inclined with respect to bottom portion BS, and an angle formed by bottom portion BS and side portion SW is 110° to 130°, for example.

Next, a gate insulating film 71 is formed. Gate insulating film 71 is formed by thermally oxidizing silicon carbide epitaxial substrate 100 in which trench TR is formed. Specifically, gate insulating film 71 is formed by heating silicon carbide epitaxial substrate 100 in which trench TR is formed at, for example, about 1300° C. in an atmosphere containing oxygen. Gate insulating film 71 may be formed to cover side portion SW, bottom portion BS, and first main surface 21.

Next, a gate electrode 72 is formed. Gate electrode 72 in contact with gate insulating film 71 is formed inside trench TR. Gate electrode 72 is disposed in trench TR, and is formed to face each of side portion SW and bottom portion BS of trench TR with gate insulating film 71 interposed therebetween. Gate electrode 72 is formed by, for example, an LPCVD (Low Pressure Chemical Vapor Deposition) method.

Next, an interlayer insulating film 73 is formed. Specifically, interlayer insulating film 73 is formed so as to cover gate electrode 72 and in contact with gate insulating film 71. Preferably, interlayer insulating film 73 is formed by deposition, and more preferably by chemical vapor deposition. Interlayer insulating film 73 is, for example, a material including silicon dioxide.

Figure 16:
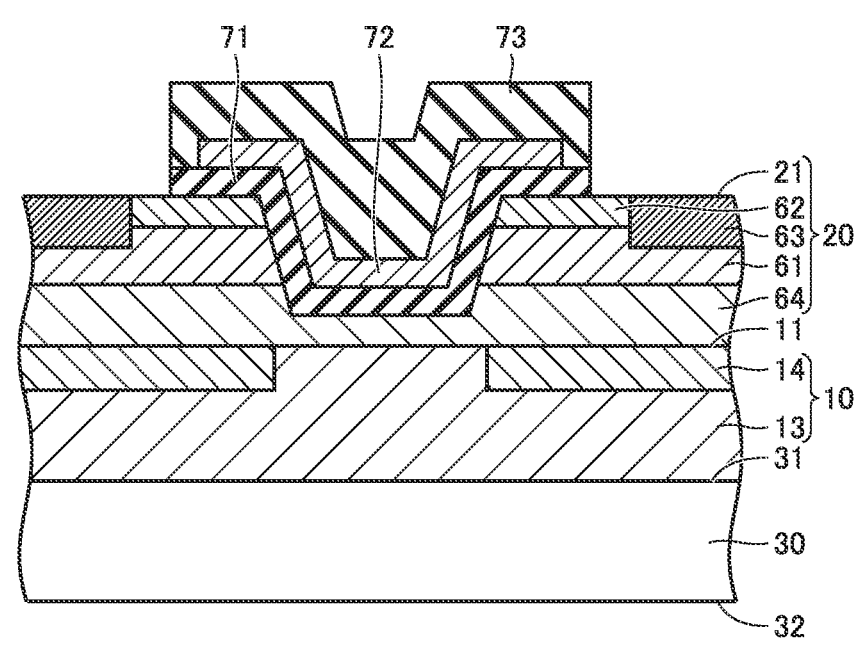
FIG. 16 is a schematic cross-sectional view showing a third step of the method of manufacturing the silicon carbide semiconductor device according to the embodiment of the present disclosure.

Next, a source electrode 80 is formed. Specifically, etching is performed so that openings are formed in interlayer insulating film 73 and gate insulating film 71, and each of source region 62 and contact region 63 is exposed from interlayer insulating film 73 through the openings (see FIG. 16). Next, an electrode layer 81 in contact with each of source region 62 and contact region 63 is formed on first main surface 21. Electrode layer 81 is made of a material containing Ti, Al, and Si, for example. Next, alloying annealing is performed. Specifically, electrode layer 81 in contact with each of source region 62 and contact region 63 is held at a temperature of, for example, 900° C. to 1100° C. for about 5 minutes. As a result, at least a part of electrode layer 81 reacts with silicon contained in silicon carbide substrate 30 and is silicided to be alloyed. Thus, electrode layer 81 is in ohmic contact with source region 62.

Figure 17:
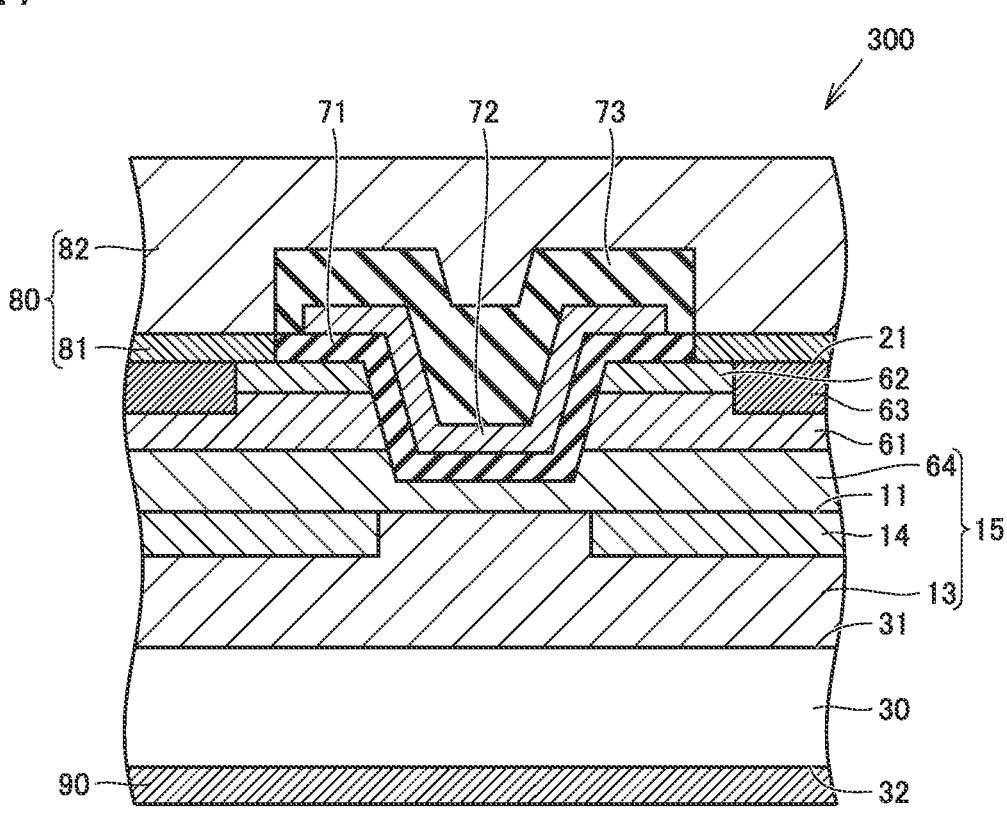
FIG. 17 is a schematic cross-sectional view showing a fourth step of the method of manufacturing the silicon carbide semiconductor device according to the embodiment of the present disclosure.

Next, a source wiring 82 is formed. Source wiring 82 is formed on electrode layer 81 and interlayer insulating film 73. Source wiring 82 includes, for example, aluminum. Thus, source electrode 80 including electrode layer 81 and source wiring 82 is formed. Next, a drain electrode 90 is formed to be in contact with second main surface 32 of silicon carbide substrate 30. Thus, a silicon carbide semiconductor device (FIG. 17) according to the embodiment of the present disclosure is obtained.

Next, functions and effects of silicon carbide epitaxial substrate 100 and the method of manufacturing the same according to the embodiment of the present disclosure will be described.

When a silicon carbide epitaxial layer is formed on silicon carbide substrate 30, a CVD apparatus is generally used. When silicon carbide substrate 30 is placed in the reaction chamber of the CVD apparatus, deposits on the inner wall of the reaction chamber of the CVD apparatus may fall onto silicon carbide substrate 30. This falling object is a particle called a downfall. The material of the particle is, for example, polycrystalline silicon carbide, carbon, or tantalum carbide (TaC).

In order to remove the downfall from silicon carbide substrate 30, a surface of silicon carbide substrate 30 may be etched with hydrogen or the like. When the surface of silicon carbide substrate 30 is etched with hydrogen or the like, the downfall is removed and the surface layer of silicon carbide substrate 30 is removed by about 1 μm. Therefore, when the hydrogen etching is performed after first silicon carbide epitaxial layer 10 is formed on silicon carbide substrate 30, the thickness of first silicon carbide epitaxial layer 10 is reduced. For example, when the hydrogen etching is performed in a case where the surface layer of first silicon carbide epitaxial layer 10 has a p-type region (second region 14) having a small thickness, the p-type region (second region 14) disappears. Therefore, hydrogen etching cannot be performed after first silicon carbide epitaxial layer 10 is formed. As a result, particles such as the downfall could not be reduced.

As a result of diligent studies on measures for removing particles such as the downfall without eliminating the p-type region, the inventors have obtained the following findings. First, in order to remove particles such as the downfall on the surface of first silicon carbide epitaxial layer 10, a method of cleaning the surface of first silicon carbide epitaxial layer 10 while suppressing etching of first silicon carbide epitaxial layer 10 was found. Specifically, silicon carbide substrate 30 on which first silicon carbide epitaxial layer 10 was formed was heated at the second temperature lower than the first temperature while allowing a gas to flow in second reaction chamber 52. Thus, particles such as the downfall on first silicon carbide epitaxial layer 10 can be removed without substantially etching first silicon carbide epitaxial layer 10.

In second silicon carbide epitaxial layer 20, a channel region of a silicon carbide semiconductor device is usually formed. When particles such as the downfall remain on first silicon carbide epitaxial layer 10, the crystallinity of the silicon carbide epitaxial layer around the particles may deteriorate in second silicon carbide epitaxial layer 20 formed on first silicon carbide epitaxial layer 10. As a result, the breakdown voltage of the silicon carbide semiconductor device may be degraded.

Before first silicon carbide epitaxial layer 10 is formed on silicon carbide substrate 30, the surface of silicon carbide substrate 30 may be hydrogen-etched to reduce the area density (first area density) of first particles 1. On the other hand, before second silicon carbide epitaxial layer 20 was formed on first silicon carbide epitaxial layer 10, the surface of first silicon carbide epitaxial layer 10 could not be hydrogen-etched, and thus the area density (second area density) of second particles 2 could not be reduced. Therefore, the value obtained by dividing the first area density by the second area density could not be made larger than 0.5.

In silicon carbide epitaxial substrate 100 according to the embodiment of the present disclosure, when the area density of first particles 1 in first silicon carbide epitaxial layer 10 is defined as a first area density and the area density of second particles 2 in second silicon carbide epitaxial layer 20 is defined as a second area density, a value determined by dividing the first area density by the second area density is more than 0.5 and less than 1. Thus, the area density of second particles 2 in second silicon carbide epitaxial layer 20 can be reduced. As a result, it is possible to suppress deterioration of the breakdown voltage of a silicon carbide semiconductor device 300 manufactured using silicon carbide epitaxial substrate 100 according to the embodiment of the present disclosure.

EXAMPLES

Sample Preparation

First, silicon carbide epitaxial substrates according to Samples 1 to 8 were prepared. The diameters of the silicon carbide epitaxial substrates according to Samples 1 to 8 were 150 mm (6 inches). The silicon carbide epitaxial substrates according to Samples 1 to 4 are comparative examples. The silicon carbide epitaxial substrates according to Samples 5 to 8 are examples. In the manufacturing steps of the silicon carbide epitaxial substrates according to Samples 1 to 4, the step (S40) of cleaning the surfaces of the first silicon carbide epitaxial layers was not performed. In the manufacturing steps of the silicon carbide epitaxial substrates according to Samples 5 to 8, the step (S40) of cleaning the surfaces of the first silicon carbide epitaxial layers was performed. The calculated flow rate of the gas during the step (S40) of cleaning the surfaces of the first silicon carbide epitaxial layers corresponded to 33.3 cm/second under standard conditions.

Experimental Method

Next, each of the first particles and the second particles was identified using WASAVI series "SICA 6X" manufactured by Lasertec Corporation. Next, each of the respective numbers of the first particles and the second particles was counted in first main surface 21 excluding the outer peripheral region within 3 mm from outer circumferential edge 5. First main surface 21 excluding the outer peripheral region within 3 mm from outer circumferential edge 5 is 161 cm$^2$.

Based on each of the respective numbers of the first particles and the second particles, a value obtained by dividing the number of the first particles by the number of the second particles was obtained. A value obtained by dividing the number of first particles by the number of second particles is a value obtained by dividing the first area density by the second area density. Silicon carbide semiconductor devices (MOSFETs) were produced using the silicon carbide epitaxial substrates according to Samples 1 to 8, and the yields of the MOSFETs were obtained. Each of the yields of the MOSFETs was determined based on whether or not the breakdown voltage of the MOSFET reached a reference value. A case where the yield was 82% or more was evaluated as "A", and a case where the yield was less than 82% was evaluated as "B".

Experimental Results

TABLE 1

| Sample No. | Cleaning Step (S40) | Number of First Particles (Number) | Number of Second Particles (Number) | Number of First Particles/ Number of Second Particles | Yield |
|---|---|---|---|---|---|
| Sample 1 | Not Performed | 13 | 37 | 0.35 | B |
| Sample 2 | Not Performed | 25 | 51 | 0.49 | B |
| Sample 3 | Not Performed | 10 | 390 | 0.03 | B |
| Sample 4 | Not Performed | 19 | 666 | 0.03 | B |
| Sample 5 | Performed | 12 | 13 | 0.92 | A |
| Sample 6 | Performed | 10 | 15 | 0.67 | A |
| Sample 7 | Performed | 7 | 11 | 0.64 | A |
| Sample 8 | Performed | 15 | 18 | 0.83 | A |

Table 1 shows the number of the first particles, the number of the second particles, a value obtained by dividing the number of the first particles by the number of the second particles, and the yield of MOSFET in each of silicon carbide epitaxial substrates 100 according to Samples 1 to 8. As shown in Table 1, when the value obtained by dividing the number of the first particles by the number of the second particles was larger than 0.5, it was confirmed that the evaluation result of the yield of the breakdown voltage of the silicon carbide semiconductor device was "A". That is, it was confirmed that deterioration of the breakdown voltage of the silicon carbide semiconductor device can be suppressed by setting the value obtained by dividing the number of first particles by the number of second particles to be larger than 0.5.

It should be understood that the embodiments and examples disclosed herein are illustrative in all respects and are not restrictive. The scope of the present invention is defined not by the above-described embodiments and examples but by the claims, and is intended to include meanings equivalent to the claims and all modifications within the scope.

REFERENCE SIGNS LIST 1 first particle, 2 second particle, 3 orientation flat, 4 arc-shaped portion, 5 outer circumferential edge, 6 first recess, 7 second recess, 10 first silicon carbide epitaxial layer, 11 boundary surface, 12 first side surface, 13 first region, 14 second region, 20 second silicon carbide epitaxial layer, 21 first main surface, 22 second side surface, 23 third side surface, 30 silicon carbide substrate, 31 third main surface, 32 second main surface, 51 first reaction chamber, 52 second reaction chamber, 53 ion implantation device, 61 body region, 62 source region, 63 contact region, 64 drift region, 71 gate insulating film, 72 gate electrode, 73 interlayer insulating film, 80 source electrode, 81 electrode layer, 82 source wiring, 90 drain electrode, 100 silicon carbide epitaxial substrate, 101 first direction, 102 second direction, 200 manufacturing apparatus, 201 reaction chamber, 202 stage, 203 heating element, 204 quartz tube, 205 inner wall surface, 207 gas inlet, 208 gas outlet, 209 rotational shaft, 210 susceptor, 231 first gas supply unit, 232 second gas supply unit, 233 third gas supply unit, 234 carrier gas supply unit, 235 gas supply unit, 241 first gas flow rate controller, 242 second gas flow rate controller, 243 third gas flow rate controller, 244 carrier gas flow rate controller, 245 controller, 300 silicon carbide semiconductor device, A maximum diameter, BS bottom portion, D1 first maximum diameter, D2 second maximum diameter, H height, SW side portion, T1 first thickness, T2 second thickness, T3 third thickness, TR trench, W width

The invention claimed is:

1. A silicon carbide epitaxial substrate comprising:
a silicon carbide substrate;
a first silicon carbide epitaxial layer disposed on the silicon carbide substrate; and
a second silicon carbide epitaxial layer disposed on the first silicon carbide epitaxial layer,
wherein when an area density of first particles in the first silicon carbide epitaxial layer is defined as a first area density and an area density of second particles in the second silicon carbide epitaxial layer is defined as a second area density, a value determined by dividing the first area density by the second area density is more than 0.5 and less than 1, and
the first particles and the second particles each have a maximum diameter of 2 $\mu$m to 50 $\mu$m,
wherein the first particles contact the silicon carbide substrate,
wherein the second particles contact the first silicon carbide epitaxial layer, wherein each first particle is surrounded by the first silicon carbide epitaxial layer and a part of each first particle is surrounded by the second silicon carbide epitaxial layer, and
wherein the first silicon carbide epitaxial layer is located between the second particles and the silicon carbide substrate.

2. The silicon carbide epitaxial substrate according to claim 1, wherein the second area density is less than 10 cm$^{-2}$.

3. The silicon carbide epitaxial substrate according to claim 1, wherein the first silicon carbide epitaxial layer includes a first region having a first conductivity type and a second region in contact with the first region and having a second conductivity type different from the first conductivity type.

4. The silicon carbide epitaxial substrate according to claim 3, wherein in a direction perpendicular to a boundary surface between the first silicon carbide epitaxial layer and the second silicon carbide epitaxial layer, the second region has a thickness of 1 $\mu$m or less.

5. The silicon carbide epitaxial substrate according to claim 1,
wherein the first silicon carbide epitaxial layer has a first conductivity type, and
the second silicon carbide epitaxial layer has a second conductivity type different from the first conductivity type.

6. The silicon carbide epitaxial substrate according to claim 1,
wherein the first silicon carbide epitaxial layer has an n-type conductivity type, and
the second silicon carbide epitaxial layer has a p-type conductivity type.

7. A method of manufacturing a silicon carbide epitaxial substrate, the method comprising:
forming a first silicon carbide epitaxial layer on a silicon carbide substrate in a first reaction chamber at a first temperature;
removing the silicon carbide substrate on which the first silicon carbide epitaxial layer is formed, from the first reaction chamber;
disposing the silicon carbide substrate on which the first silicon carbide epitaxial layer is formed, in a second reaction chamber;
heating the silicon carbide substrate on which the first silicon carbide epitaxial layer is formed, in the second reaction chamber at a second temperature while allowing a gas to flow; and
forming a second silicon carbide epitaxial layer on the first silicon carbide epitaxial layer in the second reaction chamber,
wherein the second temperature is lower than the first temperature.

8. The method of manufacturing a silicon carbide epitaxial substrate according to claim 7, wherein the second temperature is 1,500° C. or lower.

9. The method of manufacturing a silicon carbide epitaxial substrate according to claim 7, wherein a flow velocity of the gas is 15 cm/second to 200 cm/second under conditions of a temperature of 300 K and a pressure of 1 atmospheric pressure.

10. The method of manufacturing a silicon carbide epitaxial substrate according to claim 7, wherein the first reaction chamber is the same as the second reaction chamber.

11. The method of manufacturing a silicon carbide epitaxial substrate according to claim 7, wherein the first reaction chamber is different from the second reaction chamber.

\* \* \* \* \*